United States Patent
Hamparian

(10) Patent No.: US 7,038,541 B2
(45) Date of Patent: May 2, 2006

(54) ADAPTIVE FEED-FORWARD AMPLIFIERS AND THE LIKE

(75) Inventor: Simon Hamparian, Palisades Park, NJ (US)

(73) Assignee: Andrew Corporation, Orland Park, IL (US)

( * ) Notice: Subject to any disclaimer, the term of this patent is extended or adjusted under 35 U.S.C. 154(b) by 11 days.

(21) Appl. No.: 10/856,631

(22) Filed: May 28, 2004

(65) Prior Publication Data

US 2005/0264353 A1    Dec. 1, 2005

(51) Int. Cl.
*H03F 1/00*    (2006.01)
(52) U.S. Cl. ..................... 330/151; 330/149
(58) Field of Classification Search .............. 330/151, 330/149; 375/297; 455/63
See application file for complete search history.

(56) References Cited

U.S. PATENT DOCUMENTS

| | | | |
|---|---|---|---|
| 4,394,624 A | 7/1983 | Bauman | 330/151 |
| 5,334,946 A * | 8/1994 | Kenington et al. | 330/144 |
| 6,091,297 A | 7/2000 | Bar-David et al. | 330/149 |
| 6,232,838 B1 | 5/2001 | Sugimoto | 330/151 |
| 6,504,428 B1 * | 1/2003 | Cova et al. | 330/52 |
| 6,531,918 B1 | 3/2003 | Posner et al. | 330/151 |
| 6,744,316 B1 * | 6/2004 | Louis et al. | 330/151 |
| 2003/0034834 A1 | 2/2003 | Blodgett | 330/52 |

* cited by examiner

*Primary Examiner*—Henry Choe
(74) *Attorney, Agent, or Firm*—Steve Mendelsohn

(57) ABSTRACT

According to one embodiment, for an amplifier circuit employing feed-forward distortion compensation, phase and amplitude adjusters in the carrier cancellation and error cancellation loops can be continuously and simultaneously controlled to compensate for changes in the operating characteristics of the amplifier circuit. For the carrier cancellation loop, the two signals that are used to generate the error signal are sampled and used to generate control signals for the phase and amplitude adjusters that adjust the signal applied to the main amplifier. For the error cancellation loop, the two signals that are used to generate the output signal are sampled and used to generate control signals for the phase and amplitude adjusters that adjust the signal applied to the error amplifier. In each case, the control signals can be generated in the analog domain using relatively simple measurement circuitry.

31 Claims, 3 Drawing Sheets

ADAPTIVE FEED-FORWARD AMPLIFIERS AND THE LIKE

FIELD OF THE INVENTION

The present invention relates to signal processing, and, in particular, to techniques for operating amplifiers and other signal-handling equipment that employ feed-forward distortion compensation.

BACKGROUND OF THE INVENTION

Amplifiers, such as high-power amplifiers used in the base stations of wireless communication systems, typically exhibit non-linearity over their operating ranges. This non-linearity can result in noise that can corrupt or otherwise interfere with the communications. To address this problem, additional circuitry may be added to an amplifier in an attempt to linearize the effective amplifier response. Conventional techniques for linearizing amplifiers typically involve pre-distortion compensation and/or feed-forward distortion compensation.

In amplifier linearization based on pre-distortion compensation, the input signal that is to be amplified is pre-distorted prior to being applied to the amplifier in order to adjust the input signal based on known or detected non-linearities in the amplifier transfer function. In feed-forward distortion compensation, an error signal is fed forward and combined with the output of the amplifier to adjust the output signal for non-linearities in the amplifier transfer function.

FIG. 1 shows a high-level block diagram of a linearized amplifier circuit 100 according to the prior art. Amplifier circuit 100 utilizes feed-forward distortion compensation to linearize the response of a high-power amplifier (HPA) 112. Amplifier circuit 100 has a main signal path and an error signal path. The main signal path includes phase adjuster 104, amplitude adjuster 106, HPA 112, tap 114, high-power delay line 116, and coupler 118, while the error signal path includes low-power delay line 120, coupler 122, phase adjuster 126, amplitude adjuster 128, and error amplifier (EA) 130. In addition, amplifier circuit 100 includes splitter 102, pilot generator 108, coupler 110, tap 124, fixed attenuator 132, microprocessor controller 134, nulling circuits 136 and 140, log amps 138 and 142, receiver circuit 144, and tap 146.

In operation, an input signal (e.g., a radio frequency (RF) signal) is split at splitter 102, with portions of the input signal applied to the main and error signal paths, respectively. In the main signal path, the phase and/or amplitude of the signal from splitter 102 are (optionally) adjusted by phase adjuster 104 and/or amplitude adjuster 106, respectively, prior to being applied to HPA 112. If pilot generator 108 is activated, then a pilot signal is injected into the signal at coupler 110 prior to being applied to HPA 112. A portion of the amplified signal generated by HPA 112 is tapped off at tap 114 and attenuated through fixed attenuator 132. The remaining portion of the amplified signal from HPA 112 is time-aligned at delay line 116 to compensate for latency in the error signal path. A feed-forward error-compensation signal (described below) from EA 130 is subtracted from the delayed, amplified signal from delay line 116 at coupler 118 and the resulting error-compensated signal is provided as the output signal from amplifier circuit 100. Receiver circuit 144 monitors a sample of the output signal received from tap 146.

In the error signal path, the signal from splitter 102 is delayed by delay line 120 (to compensate for the timing of the corresponding portion of the main signal path). At coupler 122, the signal received from attenuator 132 is subtracted from the delayed signal from delay line 120 to generate an error signal. Phase adjuster 126 and/or amplitude adjuster 128 (optionally) adjust the phase and/or amplitude, respectively, of the error signal prior to application to EA 130. The amplified output from EA 130 is the feed-forward error-compensation signal that is subtracted from the delayed, amplified signal from delay line 116 at coupler 118 to generate the output signal.

A portion of the error signal from coupler 122 is tapped by tap 124, detected by log amp 138, and processed by microprocessor controller 134, which uses that detected signal to control the operations of nulling circuit 136, which in turn generates the control signals for phase adjuster 104 and amplitude adjuster 106. Similarly, a portion of the output signal from coupler 118 is tapped by tap 146, processed by receiver circuit 144, detected by log amp 142, and processed by microprocessor controller 134, which uses that detected signal to control the operations of nulling circuit 140, which in turn generates the control signals for phase adjuster 126 and amplitude adjuster 128.

As indicated in FIG. 1, amplifier circuit 100 has two loops: a carrier cancellation loop (i.e., Loop 1) and an error cancellation loop (i.e., Loop 2). According to the prior art, amplifier circuit 100 is tuned by first tuning the carrier cancellation loop and then tuning the error cancellation loop. In particular, the carrier cancellation loop is tuned by applying an input signal to amplifier circuit 100 (with pilot generator 108 turned off) and using phase adjuster 104 and/or amplitude adjuster 106 to adjust the phase and/or amplitude of the applied signal until the power of the error signal detected by log amp 138 is minimized.

After the carrier cancellation loop has been tuned and with the input signal typically still present, the error cancellation loop is then tuned by (i) injecting a known pilot signal (e.g., one or more continuous wave (CW) signals or a spread-spectrum signal) from pilot generator 108 at coupler 110 and (ii) with phase adjuster 104 and amplitude adjuster 106 locked in a tuned state, using phase adjuster 126 and/or amplitude adjuster 128 to adjust the phase and/or amplitude of the error signal until the power of the pilot signal detected by receiver circuit 144 is minimized (e.g., ideally zero).

In order to maintain tuning of a real-world amplifier system in which operating characteristics vary over time with changes in the input signal, the ambient temperature and humidity, and the like, the system-tuning process consisting of first tuning the carrier cancellation loop followed by the tuning of the error cancellation loop is typically repeated to dynamically adjust the operations of amplifier circuit 100.

In order for receiver circuit 144 to be able to distinguish the presence of the amplified pilot signal from the amplified input signal, the pilot signal injected at coupler 110 must be different in some way from the input signal. In some prior art implementations, pilot generator 108 is designed to generate the pilot signal as a CW signal having a frequency different from those frequencies contained in the input signal. In this case, receiver circuit 144 is typically implemented as a narrow-band detector that is able to detect the presence of the amplified CW pilot signal in the otherwise wide-band output signal.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
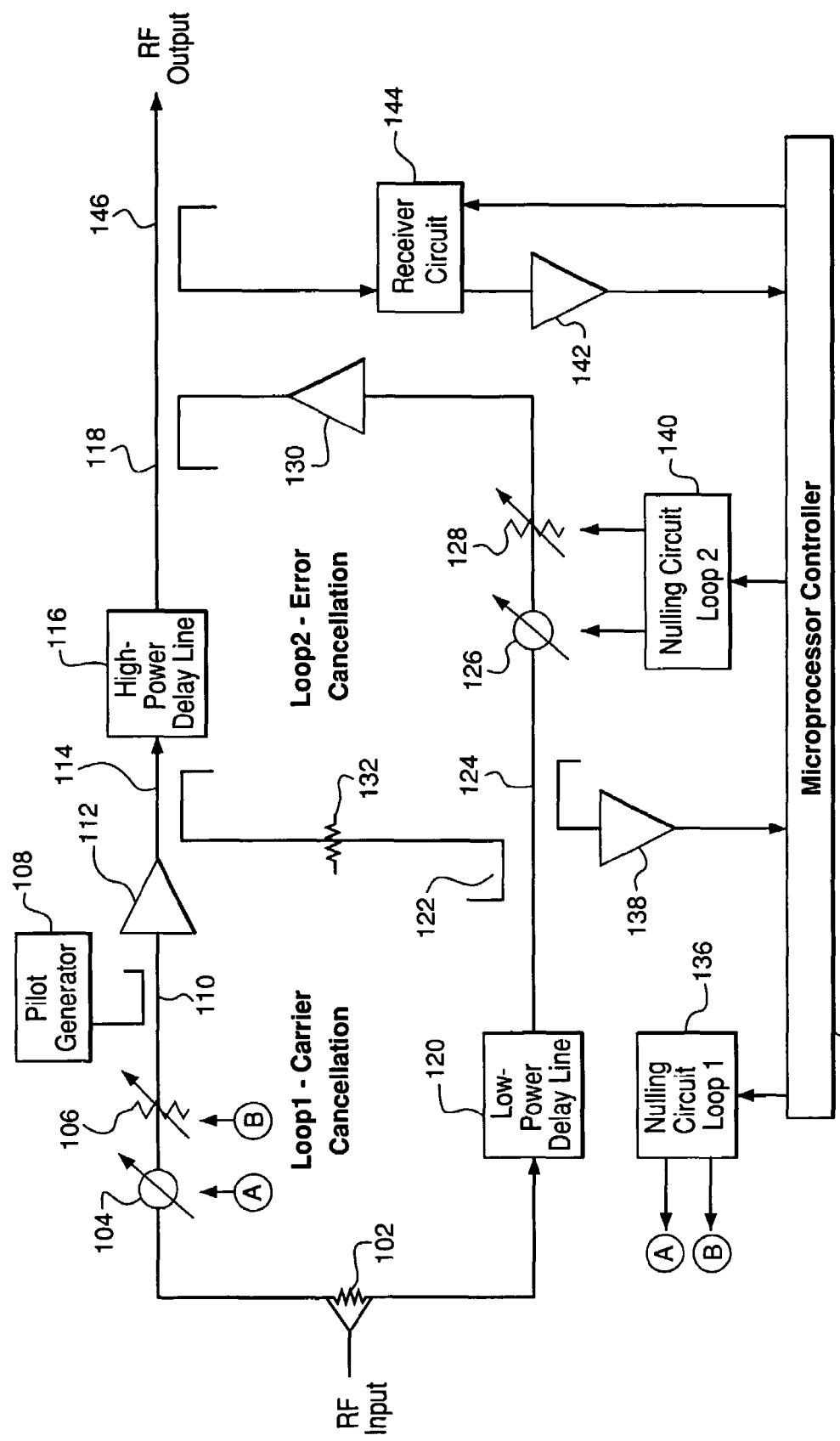
FIG. 1 is a high-level block diagram of a linearized amplifier circuit of the prior art.
Figure 2:
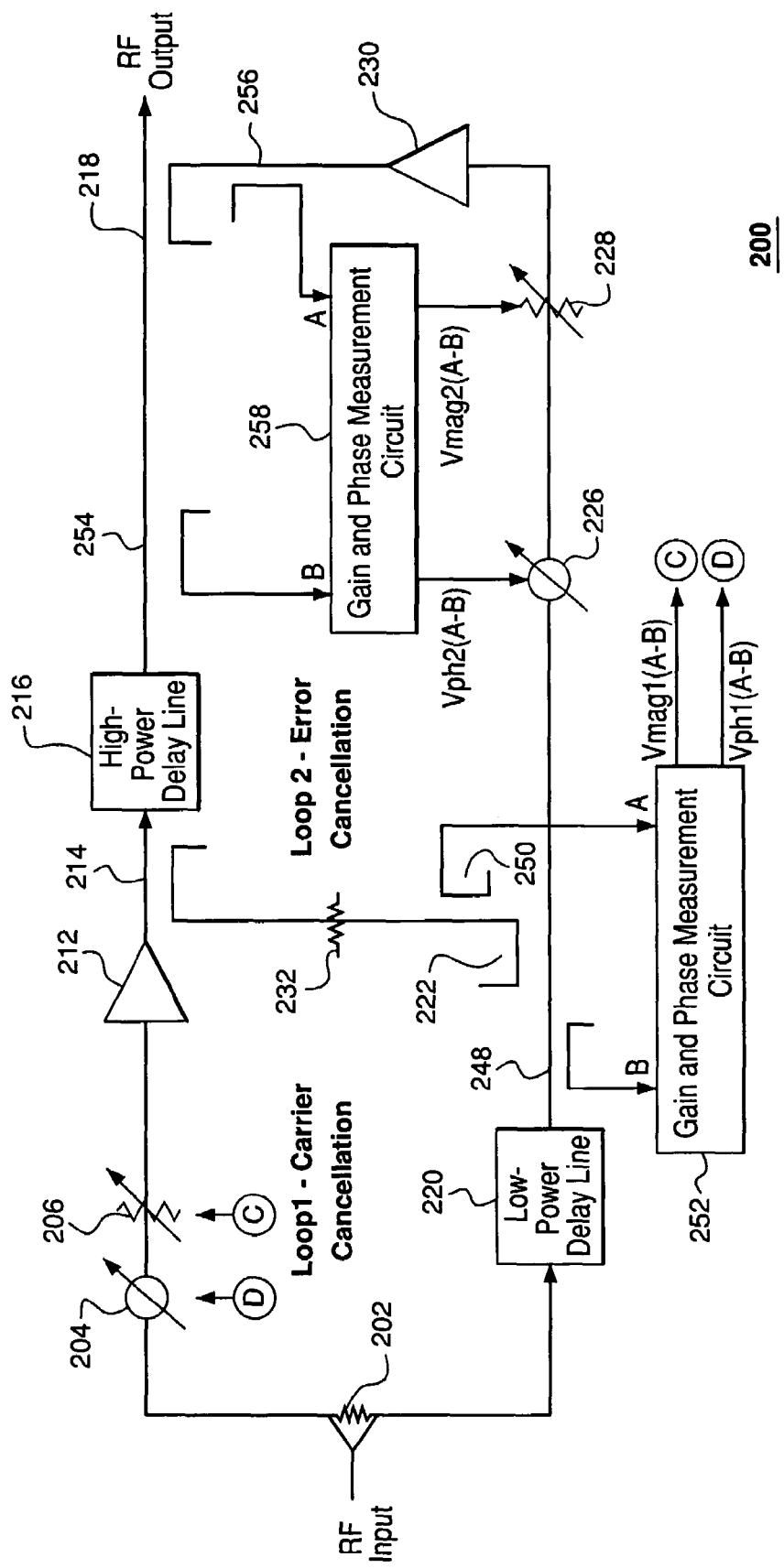
FIG. 2 is a high-level block diagram of a linearized amplifier circuit, according to one embodiment of the present invention.

FIG. 2 shows a high-level block diagram of a linearized amplifier circuit 200, according to one embodiment of the present invention. Like prior-art amplifier circuit 100 of FIG. 1, amplifier circuit 200 utilizes feed-forward distortion compensation to linearize the response of a high-power amplifier (HPA) 212. Moreover, like amplifier circuit 100, amplifier circuit 200 has a main signal path and an error signal path that, together, form a carrier cancellation loop (i.e., Loop 1 in FIG. 2) and an error cancellation loop (i.e., Loop 2 in FIG. 2). In fact, the overall signal path architecture of amplifier circuit 200 is similar to that of amplifier circuit 100, with corresponding elements similarly labeled (e.g., splitter 202 of amplifier circuit 200 corresponds to splitter 102 of amplifier circuit 100). One significant difference, however, between amplifier circuit 200 and amplifier circuit 100 is in the loop control topologies, as described below.

The main signal path of amplifier circuit 200 includes phase adjuster 204, amplitude adjuster 206, HPA 212, tap 214, high-power delay line 216, and coupler 218, while the error signal path includes low-power delay line 220, coupler 222, phase adjuster 226, amplitude adjuster 228, and error amplifier (EA) 230. In addition, amplifier circuit 200 includes splitter 202, fixed attenuator 232, taps 248, 250, 254, and 256, and gain and phase measurement circuits 252 and 258.

In one implementation, each of phase adjusters 204 and 226 is implemented using a phase shifter, and each of amplitude adjusters 206 and 228 is implemented using a voltage-controlled attenuator.

In operation, an input signal (e.g., an analog RF signal) is split at splitter 202, with portions of the input signal applied to the main and error signal paths, respectively. In the main signal path, the phase and/or amplitude of the signal from splitter 202 are (optionally) adjusted by phase adjuster 204 and/or amplitude adjuster 206, respectively, prior to being applied to HPA 212. A portion of the amplified signal generated by HPA 212 is tapped off at tap 214 and attenuated through fixed attenuator 232. The remaining portion of the amplified signal from HPA 212 is time-aligned at delay line 216 to compensate for latency in the error signal path. A feed-forward error-compensation from EA 230 is subtracted from the delayed, amplified signal from delay line 216 at coupler 218 and the resulting error-compensated signal is provided as the output signal from amplifier circuit 200.

In the error signal path, the signal from splitter 202 is delayed by delay line 220 (to compensate for the timing of the corresponding portion of the main signal path). At coupler 222, the signal received from attenuator 232 is subtracted from the delayed signal from delay line 220 to generate an error signal. Phase adjuster 226 and/or amplitude adjuster 228 (optionally) adjust the phase and/or amplitude, respectively, of the error signal prior to application to EA 230. The amplified output from EA 230 is the feed-forward error-compensation signal that is subtracted from the delayed, amplified signal from delay line 216 at coupler 218 to generate the output signal.

Tuning of the carrier cancellation loop is accomplished though a feedback circuit, which includes taps 248 and 250 and measurement circuit 252. Based on a magnitude difference between the signals sampled at taps 248 and 250, measurement circuit 252 generates a voltage control signal Vmag1(A-B) for amplitude adjuster 206, which modifies the amplitude of its received signal based on the value of Vmag1(A-B). Similarly, based on a phase difference between the signals sampled at taps 248 and 250, measurement circuit 252 generates a voltage control signal Vph1(A-B) for phase adjuster 204, which modifies the phase of its received signal based on the value of Vph1(A-B).

Analogously, tuning of the error cancellation loop is accomplished though a feedback circuit, which includes taps 254 and 256 and measurement circuit 258. Based on a magnitude difference between the signals sampled at taps 254 and 256, measurement circuit 258 generates a voltage control signal Vmag2(A-B) for amplitude adjuster 228, which operates analogously to amplitude adjuster 206. Similarly, based on a phase difference between the signals sampled at taps 254 and 256, measurement circuit 258 generates a voltage control signal Vph2(A-B) for phase adjuster 226, which operates analogously to phase adjuster 204.

Figure 3:
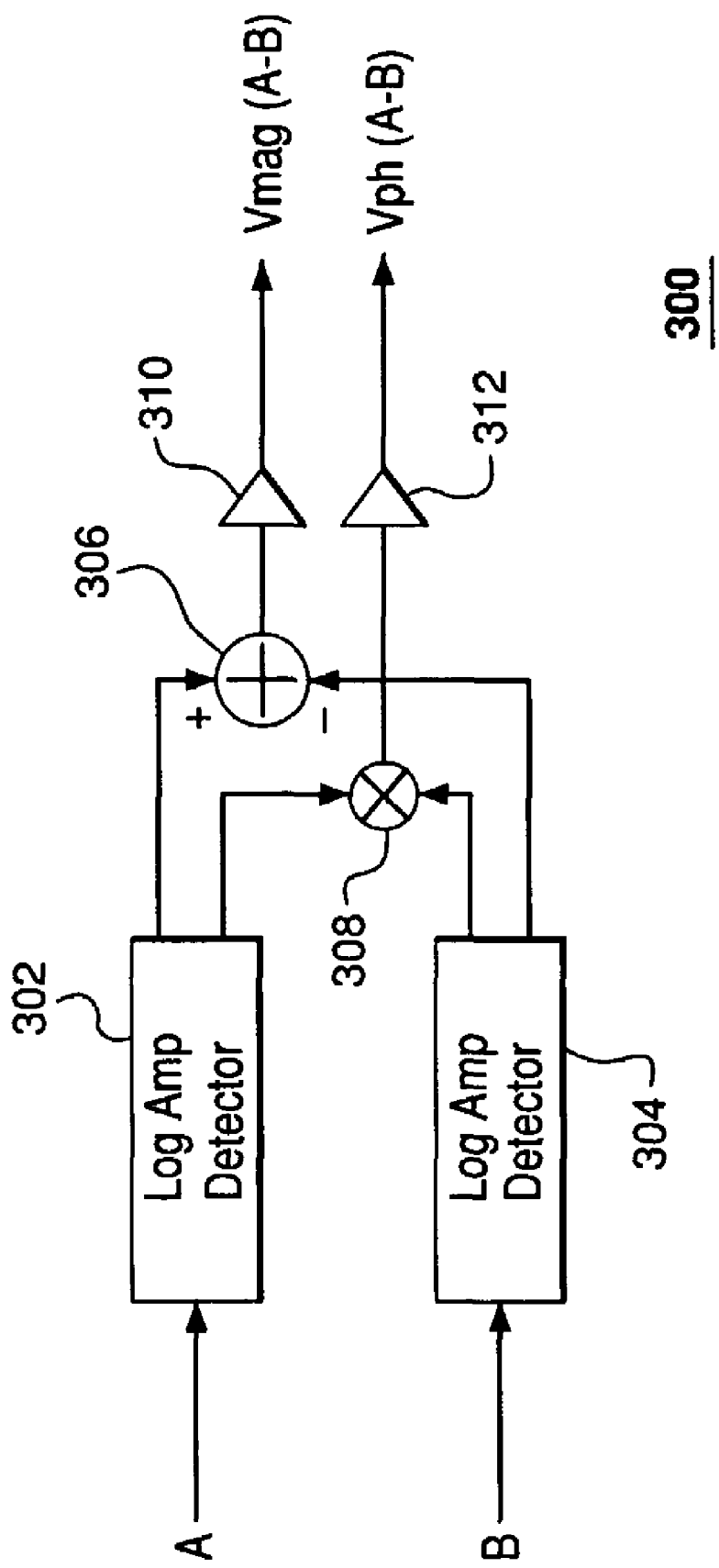
FIG. 3 shows a block diagram of circuitry that can be used for each of the two gain and phase measurement circuits of FIG. 2, according to one embodiment of the present invention.

FIG. 3 shows a block diagram of a gain and phase measurement circuit 300 that can be used for each of measurement circuits 252 and 258 of FIG. 2, according to one embodiment of the present invention. Measurement circuit 300 has log amp detectors 302 and 304, combiner (e.g., summation) node 306, multiplier node 308, and operational amplifiers (op amps) 310 and 312. Note that this implementation of measurement circuit 300 involves only analog circuitry.

In operation, measurement circuit 300 receives two analog input signals A and B, where signal A is applied to log amp detector 302 and signal B is applied to log amp detector 304. Each log amp detector condenses the dynamic range of its input signal through a logarithmic transfer function and provides a first output signal with phase information and a second output signal containing magnitude information. The output signals from detectors 302 and 304 containing phase information are combined at multiplier node 308, and the resulting product is buffered by op amp 312 to generate dc voltage control signal Vph(A-B). The difference between the output signals from detectors 302 and 304 containing magnitude information is generated at summation node 306 and subsequently buffered by op amp 310 resulting in dc voltage control signal Vmag(A-B).

When measurement circuit 300 of FIG. 3 is used to implement measurement circuit 252 of FIG. 2, control signals Vph(A-B) and Vmag(A-B) are applied to phase adjuster 204 and amplitude adjuster 206, respectively, to control the tuning of the carrier cancellation loop of amplifier circuit 200. Similarly, when measurement circuit 300 is used to implement measurement circuit 258 of FIG. 2, control signals Vph(A-B) and Vmag(A-B) are applied to phase adjuster 226 and amplitude adjuster 228, respectively, to control the tuning of the error cancellation loop of amplifier circuit 200. As such, each instance of measurement circuit 300 may be said to be a controller for a different cancellation loop in amplifier circuit 200.

Referring again to FIG. 2, the initial settings for phase adjuster 204 and amplitude adjuster 206 that maximize the carrier cancellation of Loop 1 are established as set points providing a baseline for the adjustments in the carrier cancellation loop controlled by measurement circuit 252. Likewise, the initial settings for phase adjuster 226 and amplitude adjuster 228 that maximize the error cancellation of Loop 2 are established set points providing a baseline for the adjustments in the error cancellation loop controlled by measurement circuit 258. Depending on the particular implementation, these set points can be established using any suitable means, such as automatic or manual processing based on factory testing and/or simulation results.

In any case, after the phase adjusters and amplitude adjusters of amplifier circuit 200 have been initialized to their respective set points, measurement circuits 252 and 258 can be (but do not necessarily have to be) used to continuously and simultaneously adjust those phase and amplitude adjusters to control the tuning of the two control loops to compensate for changes in the operating characteristics of the amplifier circuit.

The present invention has been described in the context of amplifier circuit 200 of FIG. 2, in which an analog RF input signal is amplified. The present invention may also be applied to amplify input signals other than analog RF signals, such as analog signals at other frequencies and/or digital signals. For example, IF signals could be amplified, or a digital input signal could be processed to generate an amplified analog output signal. In addition, in digital implementations, vector modulators can be used instead of the pairs of distinct phase and amplitude adjusters to control both the phase and amplitude of the main and error signals.

Further, the present invention has been described in the context of established set points that provide baselines for adjustments of the carrier cancellation loop and the error cancellation loop. In applications where different carriers may be used, a microprocessor control circuit can be added to automatically select predetermined set points for different carrier configurations. Additionally, an input voltage detector may be added (e.g., to detect samples of the input signal just prior to low-power delay line 220) to provide information to the microprocessor control circuit so that, based on different input voltages, appropriate set points can be selected.

The configurations of the phase and amplitude adjusters can also vary from that shown in FIG. 2. For example, since they are linear devices, the order of the adjusters can be reversed in either loop. Moreover, in theory, one or more of the adjusters can be omitted for applications that do not require such adjustments. In general, the present invention can be implemented in the context of an amplifier circuit having one or more phase/amplitude adjusters for either or both of the cancellation loops. Furthermore, FIG. 2 shows the phase and amplitude adjusters for Loop 1 located in the main signal path and the phase and amplitude adjusters for Loop 2 located in the error signal path. In theory, Loop 1 could have one or more adjusters in the error signal path (e.g., just before or just after delay line 220). Similarly, Loop 2 could have one or more adjusters in the main signal path (e.g., just before or just after delay line 216).

Although the present invention has been described in the context of an amplifier that is linearized using only feed-forward distortion compensation, the present invention can also be implemented for applications that also perform pre-distortion compensation.

The present invention may be implemented in the context of wireless signals transmitted from a base station to one or more mobile units of a wireless communication network. In theory, embodiments of the present invention could be implemented for wireless signals transmitted from a mobile unit to one or more base stations. The present invention can also be implemented in the context of other wireless and even wired communication networks.

Although the present invention has been described in the context of circuitry in which feed-forward compensation is applied to linearize the response of signal handling equipment that is the main amplifier in the main signal path, the present invention is not so limited. In general, the present invention may be employed in any suitable circuitry in which feed-forward compensation is used to adjust the effective operation of signal handling equipment, where the signal handling equipment may be other than an amplifier and the adjustments may be other than linearization.

Embodiments of the present invention may be implemented as circuit-based processes, including possible implementation on a single integrated circuit. As would be apparent to one skilled in the art, various functions of circuit elements may also be implemented as processing steps in a software program. Such software may be employed in, for example, a digital signal processor, micro-controller, or general-purpose computer.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. A signal processing circuit adapted to process an input signal to generate an output signal, the circuit comprising:
   signal handling equipment;
   a first cancellation loop comprising a first coupler adapted to generate an error signal based on (1) the input signal and (2) an output signal from the signal handling equipment; and
   a second cancellation loop having an error amplifier and a second coupler adapted to generate the output signal based on (1) an amplified version of the error signal generated by the error amplifier and (2) the output signal from the signal handling equipment, wherein:
   the first cancellation loop comprises at least one adjuster connected to adjust a signal in the first cancellation loop; and
   the signal processing circuit further comprises a controller adapted to generate a control signal for the at least one adjuster based on samples of the two signals applied to the first coupler.

2. The invention of claim 1, wherein the controller operates entirely in the analog domain.

3. The invention of claim 1, wherein:
   the at least one adjuster comprises a phase adjuster; and
   the controller comprises:
      two detectors adapted to generate two phase-information signals based on the two signals applied to the corresponding coupler; and
      circuitry adapted to generate the control signal for the phase adjuster from the two phase-information signals, wherein the phase adjuster is modified by the control signal to reduce phase difference between the two applied signals.

4. The invention of claim 3, wherein:
each detector is a log amp detector; and
the circuitry comprises a multiplier node adapted to generate the control signal based on a product of the two phase-information signals.

5. The invention of claim 1, wherein:
the at least one adjuster comprises an amplitude adjuster; and
the controller comprises:
two detectors adapted to generate two magnitude-information signals based on the two signals applied to the corresponding coupler; and
circuitry adapted to generate the control signal for the amplitude adjuster from the two magnitude-information signals, wherein the amplitude adjuster is modified by the control signal to reduce magnitude difference between the two applied signals.

6. The invention of claim 5, wherein:
each detector is a log amp detector; and
the circuitry comprises a summation node adapted to generate the control signal based on a difference between the two magnitude-information signals.

7. The invention of claim 1, wherein:
the at least one adjuster comprises a phase adjuster and an amplitude adjuster; and
the controller comprises:
two detectors adapted to generate two phase-information signals and two magnitude-information signals based on the two signals applied to the corresponding coupler; and
circuitry adapted to generate the control signals for the phase and amplitude adjusters from the two phase-information and two magnitude-information signals, respectively, wherein the phase and amplitude adjusters are modified by the control signals to reduce phase and magnitude differences between the two applied signals.

8. The invention of claim 7, wherein:
each detector is a log amp detector; and
the circuitry comprises:
a multiplier node adapted to generate one of the control signals based on a product of the two phase-information signals; and
a summation node adapted to generate another of the control signals based on a difference between the two magnitude-information signals.

9. The invention of claim 7, wherein each of the first and second cancellation loops has an instance of the controller.

10. The invention of claim 1, wherein each of the first and second cancellation loops has an instance of the controller.

11. The invention of claim 1, wherein the signal handling equipment is an amplifier and the amplified version of the error signal linearizes the output signal from the amplifier.

12. The invention of claim 1, wherein:
the first cancellation loop comprises a first phase adjuster, a first amplitude adjuster, and a first analog controller;
the first phase and amplitude adjusters are adapted to adjust the phase and amplitude of the signal applied to the signal handling equipment; and
the first analog controller is adapted to generate control signals for controlling the first phase and amplitude adjusters.

13. The invention of claim 12, wherein:
the second cancellation loop comprises a second phase adjuster, a second amplitude adjuster, and a second analog controller;
the second phase and amplitude adjusters are adapted to adjust the phase and amplitude of the signal applied to the error amplifier; and
the second analog controller is adapted to generate control signals for controlling the second phase and amplitude adjusters.

14. The invention of claim 12, wherein:
the first cancellation loop comprises:
a splitter adapted to split the input signal;
a first tap adapted to tap a sample of the output signal from the signal handling equipment; and
the first coupler adapted to generate the error signal based on (1) the tapped sample of the output signal from the signal handling equipment and (2) one copy of the input signal, wherein:
the first phase adjuster and the first amplitude adjuster are adapted to adjust the phase and amplitude of another copy of the input signal before it is applied to the signal handling equipment; and
the first analog controller is adapted to receive samples of the two signals applied to the first coupler and generate the control signals for controlling the first phase adjuster and the first amplitude adjuster.

15. The invention of claim 14, wherein the first analog controller comprises:
two detectors adapted to generate voltage signals corresponding to the two signals applied to the first coupler;
a multiplier adapted to multiply two of the voltage signals to generate a phase control signal for the first phase adjuster; and
a combiner adapted to subtract two of the voltage signals to generate an amplitude control signals for the first amplitude adjuster.

16. The invention of claim 1, wherein:
the second cancellation loop comprises a second phase adjuster, a second amplitude adjuster, and a second analog controller; and
the second analog controller is adapted to generate control signals for controlling the second phase adjuster and the second amplitude adjuster.

17. The invention of claim 16, wherein:
the second cancellation loop comprises the second coupler adapted to generate the output signal based on (1) the amplified version of the error signal generated by the error amplifier and (2) the output signal from the signal handling equipment;
the second phase adjuster and the second amplitude adjuster are adapted to adjust the phase and amplitude of the error signal before it is applied to the error amplifier; and
the second analog controller is adapted to receive samples of the two signals applied to the second coupler and generate the control signals for controlling the second phase adjuster and the second amplitude adjuster.

18. The invention of claim 17, wherein the second analog controller comprises:
two detectors adapted to generate voltage signals corresponding to the two signals applied to the second coupler;
a multiplier adapted to multiply two of the voltage signals to generate a phase control signal for the second phase adjuster; and
a combiner adapted to subtract two of the voltage signals to generate an amplitude control signals for the second amplitude adjuster.

19. A signal processing circuit adapted to process an input signal to generate an output signal, the circuit comprising:

signal handling equipment;

a first cancellation loop adapted to generate an error signal based on (1) the input signal and (2) an output signal from the signal handling equipment; and a second cancellation loop having an error amplifier and adapted to generate the output signal based on (1) an amplified version of the error signal generated by the error amplifier and (2) the output signal from the signal handling equipment, wherein:

the first cancellation loop comprises
  a splitter adapted to split the input signal;
  a first tap adapted to tap a sample of the output signal from the signal handling equipment;
  a first coupler adapted to generate the error signal based on (1) the tapped sample of the output signal from the signal handling equipment and (2) one copy of the input signal;
  a first phase adjuster and a first amplitude adjuster adapted to adjust the phase and amplitude of another copy of the input signal before it is applied to the signal handling equipment; and
  a first analog controller adapted to receive samples of the two signals applied to the first coupler and generate the control signals for controlling the first phase adjuster and the first amplitude adjuster.

20. The invention of claim 19, wherein the first analog controller comprises:

two detectors adapted to generate voltage signals corresponding to the two signals applied to the first coupler;

a multiplier adapted to multiply two of the voltage signals to generate a phase control signal for the first phase adjuster; and a combiner adapted to subtract two of the voltage signals to generate an amplitude control signals for the first amplitude adjuster.

21. The invention of claim 19, wherein the second cancellation loop comprises:

a second coupler adapted to generate the output signal based on (1) the amplified version of the error signal generated by the error amplifier and (2) a signal based on the output signal from the signal handling equipment;

a second phase adjuster and a second amplitude adjuster adapted to adjust the phase and amplitude of the error signal before it is applied to the error amplifier; and a second analog controller adapted to receive samples of the two signals applied to the second coupler and generate the control signals for controlling the second phase adjuster and the second amplitude adjuster.

22. The invention of claim 21, wherein the second analog controller comprises:

two detectors adapted to generate voltage signals corresponding to the two signals applied to the second coupler;

a multiplier adapted to multiply two of the voltage signals to generate a phase control signal for the second phase adjuster; and a combiner adapted to subtract two of the voltage signals to generate an amplitude control signals for the second amplitude adjuster.

23. A signal processing circuit adapted to process an input signal to generate an output signal, the circuit comprising:

signal handling equipment;

a first cancellation loop adapted to generate an error signal based on (1) the input signal and (2) an output signal from the signal handling equipment; and a second cancellation loop having an error amplifier and adapted to generate the output signal based on (1) an amplified version of the error signal generated by the error amplifier and (2) a signal based on the output signal from the signal handling equipment, wherein:

the second cancellation loop comprises:
  a second coupler adapted to generate the output signal based on (1) the amplified version of the error signal generated by the error amplifier and (2) a signal based on the output signal from the signal handling equipment;
  a second phase adjuster and a second amplitude adjuster adapted to adjust the phase and amplitude of the error signal before it is applied to the error amplifier; and
  a second analog controller adapted to receive samples of the two signals applied to the second coupler and generate the control signals for controlling the second phase adjuster and the second amplitude adjuster.

24. The invention of claim 23, wherein the second analog controller comprises:

two detectors adapted to generate voltage signals corresponding to the two signals applied to the second coupler;

a multiplier adapted to multiply two of the voltage signals to generate a phase control signal for the second phase adjuster; and a combiner adapted to subtract two of the voltage signals to generate an amplitude control signals for the second amplitude adjuster.

25. A feed-forward amplifier circuit adapted to process an input signal to generate an output signal, the circuit comprising:

a splitter adapted to split the input signal;

at least one first adjuster adapted adjust one copy of the input signal;

a main amplifier adapted to amplify the first adjusted copy of the input signal;

a first tap adapted to sample the output of the main amplifier;

a first coupler adapted to generate an error signal based on (1) the sampled output of the main amplifier and (2) another copy of the input signal;

at least one second adjuster adapted to adjust the error signal;

an error amplifier adapted to amplify the adjusted error signal;

a second coupler adapted to generate the output signal based on (1) the output of the main amplifier and (2) the output of the error amplifier;

a first controller adapted to receive samples of the two signals applied to the first coupler and generate control signals for the at least one first adjuster; and a second controller adapted to receive samples of the two signals applied to the second coupler and generate control signals for the at least one second adjuster.

26. The invention of claim 25, wherein:

the at least one first adjuster comprises a first phase adjuster and a first amplitude adjuster; and the at least one second adjuster comprises a second phase adjuster and a second amplitude adjuster.

27. The invention of claim 26, wherein:

the first controller is an analog controller comprising:
- two detectors adapted to generate voltage signals corresponding to the two signals applied to the first coupler;
- a multiplier adapted to multiply two of the voltage signals to generate a phase control signal for the first phase adjuster; and
- a combiner adapted to subtract two of the voltage signals to generate an amplitude control signal for the first amplitude adjuster; and the second controller is an analog controller comprising:
- two detectors adapted to generate voltage signals corresponding to the two signals applied to the second coupler;
- a multiplier adapted to multiply two of the voltage signals to generate a phase control signal for the second phase adjuster; and
- a combiner adapted to subtract two of the voltage signals to generate an amplitude control signal for the second amplitude adjuster.

28. The invention of claim 1, wherein:

the samples of the two signals applied to the first coupler are analog signals;

the control signal for the at least one adjuster is an analog signal; and the controller is adapted to convert the two analog signals into the control signal entirely in the analog domain.

29. The invention of claim 18, wherein:

the samples of the two signals applied to the first coupler are analog signals;

the control signals for the first phase adjuster and the first amplitude adjuster are analog signals; and the first analog controller is adapted to convert the two analog signals into the control signals entirely in the analog domain.

30. The invention of claim 23, wherein:

the samples of the two signals applied to the second coupler are analog signals;

the control signals for the second phase adjuster and the second amplitude adjuster are analog signals; and the second analog controller is adapted to convert the two analog signals into the control signals entirely in the analog domain.

31. The invention of claim 25, wherein:

the samples of the two signals applied to the first coupler are first analog signals;

the control signals for the at least one first adjuster are analog signals;

the first controller is adapted to convert the two first analog signals into the control signals for the at least one first adjuster entirely in the analog domain;

the samples of the two signals applied to the second coupler are second analog signals;

the control signals for the at least one second adjuster are analog signals; and the second controller is adapted to convert the two second analog signals into the control signals for the at least one second adjuster entirely in the analog domain.

* * * * *